(12) United States Patent
Fukuda et al.

(10) Patent No.: US 10,637,434 B2
(45) Date of Patent: Apr. 28, 2020

(54) ELASTIC WAVE DEVICE, HIGH-FREQUENCY FRONT END CIRCUIT AND COMMUNICATION DEVICE

(71) Applicant: Murata Manufacturing Co., Ltd., Nagaokakyo-shi, Kyoto-fu (JP)

(72) Inventors: Daisuke Fukuda, Nagaokakyo (JP); Shinichi Fukuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 325 days.

(21) Appl. No.: 15/724,567

(22) Filed: Oct. 4, 2017

(65) Prior Publication Data

US 2018/0131345 A1    May 10, 2018

(30) Foreign Application Priority Data

Nov. 8, 2016  (JP) .................. 2016-218138

(51) Int. Cl.
| | | |
|---|---|---|
| *H03H 9/05* | (2006.01) | |
| *H03H 9/10* | (2006.01) | |
| *H01L 41/08* | (2006.01) | |
| *H01L 41/09* | (2006.01) | |
| *C30B 29/30* | (2006.01) | |
| *H01L 41/187* | (2006.01) | |
| *H01L 41/253* | (2013.01) | |
| *H01L 41/277* | (2013.01) | |
| *H03H 9/02* | (2006.01) | |
| *H03H 9/25* | (2006.01) | |

(52) U.S. Cl.
CPC ........... *H03H 9/0514* (2013.01); *C30B 29/30* (2013.01); *H01L 41/081* (2013.01); *H01L 41/09* (2013.01); *H01L 41/1873* (2013.01); *H01L 41/253* (2013.01); *H01L 41/277* (2013.01); *H03H 9/02559* (2013.01); *H03H 9/02574* (2013.01); *H03H 9/1071* (2013.01); *H03H 9/25* (2013.01); *H01L 2224/11* (2013.01)

(58) Field of Classification Search
CPC ........... H03H 9/02559; H03H 9/02574; H03H 9/1071; H01L 41/053
USPC ..... 310/313 R, 313 A, 313 B, 313 C, 313 D, 310/348
See application file for complete search history.

(56) References Cited

U.S. PATENT DOCUMENTS

| | | | | |
|---|---|---|---|---|
| 2007/0058003 | A1* | 3/2007 | Aoki ..................... | H03H 9/0547 347/68 |
| 2013/0106536 | A1* | 5/2013 | Miura ..................... | H03H 9/25 333/195 |
| 2014/0191617 | A1* | 7/2014 | Ohashi ................. | H03H 9/1092 310/348 |

FOREIGN PATENT DOCUMENTS

JP      2010-278972 A    12/2010

* cited by examiner

*Primary Examiner* — Derek J Rosenau
(74) *Attorney, Agent, or Firm* — Keating & Bennett, LLP

(57) ABSTRACT

An elastic wave device includes a piezoelectric substrate, an IDT electrode on the piezoelectric substrate, a support member that is provided on the piezoelectric substrate so as to surround the IDT electrode, a cover that covers the support member, via electrodes that penetrate through the support member and the cover, and bumps that are bonded to the via electrodes. The IDT electrode is located in a hollow space that is enclosed by the piezoelectric substrate, the support member and the cover. A protruding portion extends along at least a portion of an outer peripheral edge of a surface of the cover that is on the opposite side from the piezoelectric substrate, and the protruding portion extends in a direction away from the piezoelectric substrate.

15 Claims, 5 Drawing Sheets

ELASTIC WAVE DEVICE, HIGH-FREQUENCY FRONT END CIRCUIT AND COMMUNICATION DEVICE

CROSS REFERENCE TO RELATED APPLICATIONS

This application claims the benefit of priority to Japanese Patent Application No. 2016-218138 filed on Nov. 8, 2016. The entire contents of this application are hereby incorporated herein by reference.

BACKGROUND OF THE INVENTION

1. Field of the Invention

The present invention relates to an elastic wave device, a high-frequency front end circuit and a communication device.

2. Description of the Related Art

To date, elastic wave devices have been widely used in filters of cellular phone devices and so forth. An example of such an elastic wave device is disclosed in Japanese Unexamined Patent Application Publication No. 2010-278972. The elastic wave device disclosed in Japanese Unexamined Patent Application Publication No. 2010-278972 includes a piezoelectric substrate, a support member that is provided on the piezoelectric substrate, and a cover that is provided on the support member. The elastic wave device is provided with a hollow space that is enclosed by the piezoelectric substrate, the support member and the cover. An IDT electrode is provided on the piezoelectric substrate so as to face the hollow space. Via electrodes are provided so as to penetrate through the support member and the cover, and bumps are bonded to the via electrodes. Thus, the elastic wave device disclosed in Japanese Unexamined Patent Application Publication No. 2010-278972 is an elastic wave device having a wafer level package (WLP) structure.

The elastic wave device disclosed in Japanese Unexamined Patent Application Publication No. 2010-278972 is mounted on a mounting substrate via the bumps. Specifically, before mounting the elastic wave device, oxide films are removed from the surfaces of the bumps by using flux. The elastic wave device is mounted on the mounting substrate by heating the bumps in order to melt the bumps. At this time, the flux, which is attached to the bumps, evaporates due to being heated. Therefore, there is a risk of the evaporated flux causing corrosion of other electronic components and members and of the functionality of the other electronic components and members being degraded.

In addition, there is a risk of the evaporated flux entering the hollow space inside the WLP in a direction from the cover toward the piezoelectric substrate and of the characteristics of the device being degraded due to the evaporated flux contacting the electrode that is exposed inside the WLP.

SUMMARY OF THE INVENTION

Preferred embodiments of the present invention provide elastic wave devices, high-frequency front end circuits and communication devices that significantly reduce or prevent effects on other electronic components and members and degradation of characteristics that are caused by flux used when performing bump mounting.

An elastic wave device according to a preferred embodiment of the present invention includes a piezoelectric body; a functional electrode that is provided on the piezoelectric body; a support member that is provided on the piezoelectric body so as to surround the functional electrode; a cover that is provided so as to cover the support member; a via electrode that penetrates through the support member and the cover; and a bump that is bonded to the via electrode. The functional electrode is located in a hollow space enclosed by the piezoelectric body, the support member and the cover. A protruding portion is provided along at least a portion of an outer peripheral edge of a surface of the cover that is on the opposite side from the piezoelectric body. The protruding portion extends in a direction away from the piezoelectric body.

In an elastic wave device according to a preferred embodiment of the present invention, in plan view, the protruding portion may be frame-shaped or substantially frame-shaped and may be provided along the entire outer peripheral edge of the surface of the cover that is on the opposite side from the piezoelectric body. In this case, a situation in which evaporated flux diffuses into the region outside the cover is able to be more effectively reduced or prevented to a greater degree. Therefore, the effect on other electronic components and members caused by flux used when performing bump mounting is able to be more effectively reduced or prevented to a greater degree.

In an elastic wave device according to a preferred embodiment of the present invention, the cover may be made of a resin. In this case, the protruding portion is able to be easily provided.

In an elastic wave device according to a preferred embodiment of the present invention, the cover may include a first layer that is provided on the support member, and a second layer that is provided on the first layer.

In an elastic wave device according to a preferred embodiment of the present invention, the functional electrode may be an IDT electrode.

A high-frequency front end circuit according to another preferred embodiment of the present invention includes an elastic wave device according to a preferred embodiment of the present invention, and a power amplifier.

A communication device according to yet another preferred embodiment of the present invention includes the high-frequency front end circuit according to another preferred embodiment of the present invention, and an RF signal processing circuit.

Preferred embodiments of the present invention provide elastic wave devices, high-frequency front end circuits and communication devices that significantly reduce or prevent effects on other electronic components and members and degradation of characteristics that are caused by flux used when performing bump mounting.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
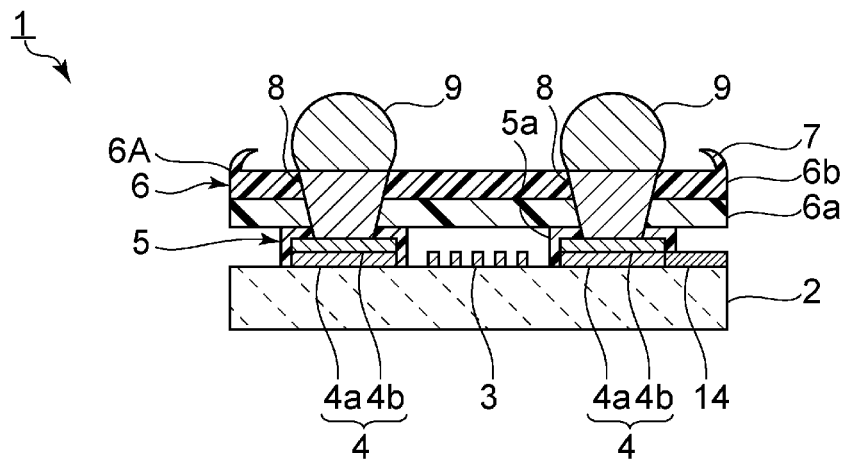
FIG. 1 is a front sectional view of an elastic wave device according to a first preferred embodiment of the present invention.

Hereafter, the present invention will be made clearer by describing specific preferred embodiments of the present invention while referring to the drawings.

The preferred embodiments described in the present specification are illustrative examples and it should be noted that portions of the configurations illustrated in different preferred embodiments can be substituted for one another or combined with one another.

Figure 2:
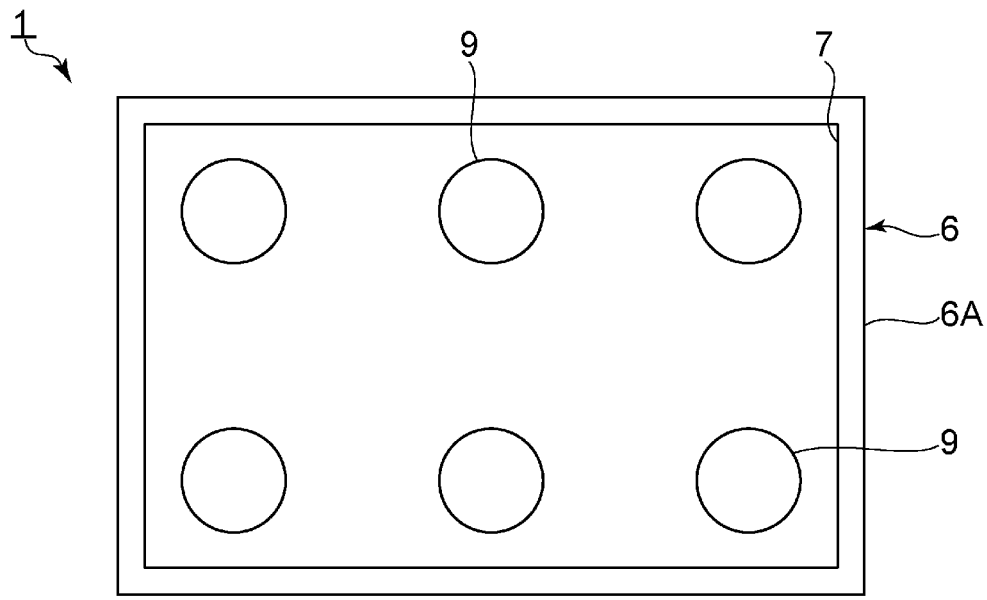
FIG. 2 is a plan view of the elastic wave device according to the first preferred embodiment of the present invention.

FIG. 1 is a front sectional view of an elastic wave device according to a first preferred embodiment of the present invention. FIG. 2 is a plan view of the elastic wave device according to the first preferred embodiment.

An elastic wave device 1 includes a piezoelectric substrate 2 as a piezoelectric body. The piezoelectric substrate is not especially limited, and may be preferably made of a piezoelectric single crystal such as $LiNbO_3$ or $LiTaO_3$ or a suitable piezoelectric ceramic, for example.

An IDT electrode 3, which is a functional electrode, is provided on the piezoelectric substrate 2. Electrode pads 4, which are electrically connected to the IDT electrode 3, are provided on the piezoelectric substrate 2. Each electrode pad 4 includes a first electrode layer 4a, which is provided on the piezoelectric substrate 2, and a second electrode layer 4b, which is provided on the first electrode layer 4a. Since the electrode pads 4 each include two electrode layers, the electrical resistance of the electrode pads 4 is low. Alternatively, the electrode pads 4 may each include a single electrode layer.

A support member 5, which includes an opening 5a, is provided on the piezoelectric substrate 2. The support member 5 surrounds the IDT electrode 3 via the opening 5a. The support member 5 covers the electrode pads 4. The support member 5 is composed of a suitable resin, for example.

A cover 6 is provided on the support member 5. The cover includes a first layer 6a, which is provided on the support member 5, and a second layer 6b, which is provided on the first layer 6a. The first layer 6a is preferably made of an epoxy resin, for example. Thus, the bonding force between the cover 6 and the support members 5 is able to be made high. The second layer 6b is preferably made of polyimide, for example. Thus, the strength of the cover 6 is able to be made high. The cover 6 is preferably made of a resin in this way. In this case, a protruding portion, which is described below, is able to be easily provided. The configuration of the cover 6 is not especially limited, and the cover 6 may be defined by a single layer, for example.

The IDT electrode 3 is located in a hollow space enclosed by the piezoelectric substrate 2, the support member 5 and the cover 6.

A protruding portion 7 is provided along an outer peripheral edge 6A of a surface of the cover 6 that is on the opposite side from the piezoelectric substrate 2. More specifically, the protruding portion 7 extends from the outer peripheral edge 6A in a direction away from the piezoelectric substrate 2. In this preferred embodiment, the protruding portion 7 curves so as to extend toward the inside of the elastic wave device 1 in plan view. The protruding portion 7 is provided so as to be arranged on the inner side of the cover 6 in plan view. Thus, a situation in which flux that is adhered to bumps 9, which are described later, evaporates and scatters to the outside from the cover 6 when mounting is performed is able to be significantly reduced or prevented.

As illustrated in FIG. 2, the protruding portion 7 is frame-shaped or substantially frame-shaped in plan view, and is provided along the entire outer peripheral edge 6A of the surface of the cover 6 that is on the opposite side from the piezoelectric substrate 2. Scattering of the flux is able to be significantly reduced or prevented as a result of the entire outer periphery of the surface being surrounded by the protruding portion 7. It is sufficient that the protruding portion 7 be provided along at least a portion of the outer peripheral edge 6A of the cover 6.

Returning to FIG. 1, in this preferred embodiment, the protruding portion 7 is preferably made of the same material as the second layer 6b of the cover 6 and is provided so as to be integrated with the second layer 6b of the cover 6.

Via electrodes 8 are provided so as to penetrate through the support member 5 and the cover 6. One end of each via electrode 8 is connected to a corresponding electrode pad 4. Bumps 9 are provided so as to be bonded to the other ends of the via electrodes 8. The bumps 9 are preferably solder, for example.

Thus, the elastic wave device 1 of this preferred embodiment preferably is an elastic wave device with a WLP structure, for example. The IDT electrode 3 is electrically connected to the outside through the electrode pads 4, the via electrodes 8 and the bumps 9. In addition, it is sufficient that the elastic wave device 1 be an elastic wave device with a WLP structure, and the functional electrode provided on the piezoelectric substrate 2 does not have to be an IDT electrode.

In this preferred embodiment, a wiring electrode 14, which is provided on the piezoelectric substrate 2, is connected to the electrode pads 4. The wiring electrode 14 extends to the outside of the support member 5, and reaches the outer peripheral edge of the piezoelectric substrate 2. The wiring electrode 14 is a power feeding wiring line that is used to form the via electrodes 8 in the process of manufacturing the elastic wave device 1 of this preferred embodiment. The wiring electrode 14 does not have to be provided.

One of the unique features of a preferred embodiment of the present invention is that the protruding portion 7 is provided along at least a portion of the outer peripheral edge 6A of the surface of the cover 6 that is on the opposite side from the piezoelectric substrate 2. As a result, the effect on other electronic components and members and degradation of characteristics that are caused by flux used when performing bump mounting can be suppressed. This is described below.

When mounting the elastic wave device 1, the elastic wave device 1 is bonded to a mounting substrate or the like using the bumps 9. Before being mounted, flux is typically adhered to the bumps 9. When mounting is performed, the bumps 9 are melted by being heated, and then bonded to a mounting substrate or the like. The flux attached to the bumps 9 evaporates at this time. Since the cover 6 is on the lower side and the piezoelectric substrate 2 is on the upper side when the elastic wave device 1 is mounted, the evaporated flux floats toward the piezoelectric substrate 2 and the region outside the cover 6. In this preferred embodiment, the protruding portion 7 is provided along the outer peripheral edge 6A of the cover 6. Therefore, the evaporated flux readily adheres to the protruding portion 7 and the surface of the cover 6 on the opposite side from the piezoelectric substrate 2 when the flux floats toward the region outside the cover 6. Thus, a situation in which evaporated flux diffuses into the region outside the cover 6 is able to be significantly reduced or prevented. Therefore, a situation in which other electronic components and members are corroded by the flux is able to be significantly reduced or prevented, and degradation of functionality is able to be significantly reduced or prevented.

In addition, in this preferred embodiment, a situation in which evaporated flux floats around from the cover 6 toward the piezoelectric substrate 2 is able to be significantly reduced or prevented, and a situation in which flux adheres to the support member 5 and the piezoelectric substrate 2 is able to be significantly reduced or prevented. Thus, it is unlikely that flux will evaporate from the support member 5 and the piezoelectric substrate 2 due to heating or the like performed after mounting. Therefore, degradation of the functionality of other electronic components and members caused by flux is able to be significantly reduced or prevented with more certainty.

In addition, there is a risk of flux entering the inside of the hollow space enclosed by the piezoelectric substrate 2, the support member 5 and the cover 6 and corrosion of electrodes such as the IDT electrode 3 inside the hollow space being caused. Therefore, there is a risk of the characteristics of the elastic wave device 1 being degraded. With respect to this, in this preferred embodiment, since a situation in which flux enters the inside of the hollow space is able to be significantly reduced or prevented, degradation of the characteristics of the elastic wave device 1 is able to be significantly reduced or prevented.

Meanwhile, in the case where the elastic wave device 1 has the wiring electrode 14 as illustrated in FIG. 1, there is a risk of a property of the IDT electrode 3 being sealed being particularly degraded when the wiring electrode 14 experiences corrosion or the like. Or there is a risk of the electrode pads 4 also being damaged as a result of the wiring electrode 14 being damaged. In this preferred embodiment, since flux is unlikely to float around to the wiring electrode 14, a situation in which flux reaches the wiring electrode 14 also is able to be significantly reduced or prevented. Therefore, the elastic wave device 1 is not likely to be damaged.

It is preferable that the protruding portion 7 be provided along the entire outer peripheral edge 6A of the cover 6 as in this preferred embodiment. With this configuration, evaporated flux is readily trapped in a space surrounded by the cover 6 and the protruding portion 7. Therefore, diffusion of flux into the region outside the cover 6 is able to be significantly reduced or prevented to a greater extent, and a situation in which flux floats around from the cover 6 toward the piezoelectric substrate 2 is able to be significantly reduced or prevented to a greater extent.

It is sufficient that the protruding portion 7 be provided along at least a portion of the outer peripheral edge 6A of the cover 6. In this case as well, evaporated flux readily adheres to the protruding portion 7 and the surface of the cover 6 on the opposite side from the piezoelectric substrate 2 when the flux floats toward the piezoelectric substrate 2 and the region outside the cover 6. Therefore, diffusion of evaporated flux into the region outside the cover 6 is able to be significantly reduced or prevented, and a situation in which evaporated flux floats around from the cover 6 toward the piezoelectric substrate 2 is able to be significantly reduced or prevented.

Figure 3:
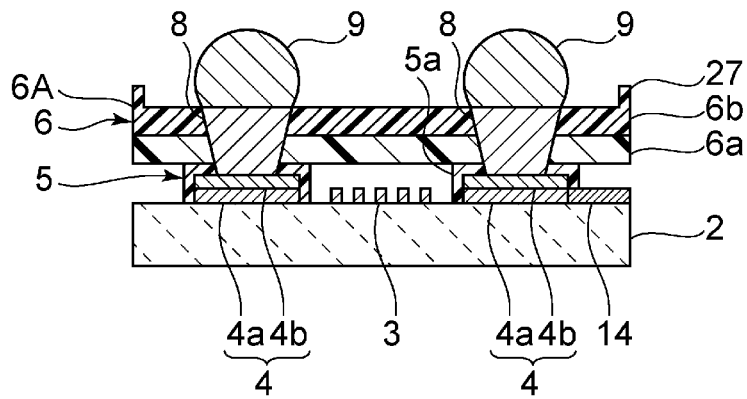
FIG. 3 is a front sectional view of an elastic wave device according to a first modification of the first preferred embodiment of the present invention.
Figure 4:
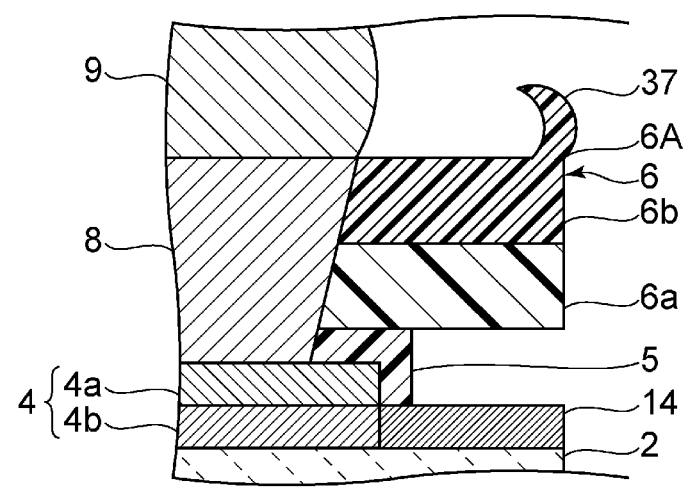
FIG. 4 is an enlarged front sectional view of an elastic wave device according to a second modification of the first preferred embodiment of the present invention.

It is sufficient that the protruding portion 7 extend in a direction away from the piezoelectric substrate 2, and the shape of the protruding portion 7 is not especially limited. For example, a protruding portion 27 of a first modification of the first preferred embodiment illustrated in FIG. 3 extends in a linear manner in a direction away from the piezoelectric substrate 2. In contrast, a protruding portion 37 of a second modification of the first preferred embodiment illustrated in FIG. 4 is curved such that the protruding portion 37 partly extends outside the outer peripheral edge 6A in plan view from the outer peripheral edge 6A of the cover 6 and then extends toward the inside. Thus, a portion of the protruding portion 37 may be positioned outside the outer peripheral edge 6A in plan view.

Figure 5:
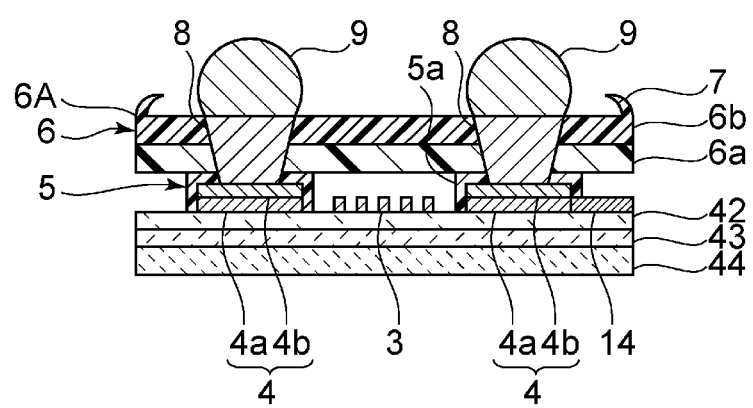
FIG. 5 is a front sectional view of an elastic wave device according to a third modification of the first preferred embodiment of the present invention.

Meanwhile, although the piezoelectric body is the piezoelectric substrate 2 in the first preferred embodiment, the piezoelectric body may be a piezoelectric thin film 42 as in a third modification of the first preferred embodiment illustrated in FIG. 5. For example, a low-acoustic-velocity film 43 may be provided on a surface of the piezoelectric thin film 42 that is on the opposite side from the surface of the piezoelectric thin film 42 on which the IDT electrode 3 is provided. A high-acoustic-velocity member 44 may be provided on a surface of the low-acoustic-velocity film 43 that is on the opposite side from the piezoelectric thin film 42.

Here, the low-acoustic-velocity film 43 is a film in which the acoustic velocity of a bulk wave that propagates therethrough is lower than the acoustic velocity of an elastic wave that propagates through the piezoelectric thin film 42. The low-acoustic-velocity film 43 is composed of glass, silicon oxynitride, tantalum oxide, or a material having as a main component a compound obtained by adding fluorine, carbon or boron to silicon oxide. In addition, it is sufficient that the material of the low-acoustic-velocity film 43 be any material having a relatively low acoustic velocity.

The high-acoustic-velocity member 44 is a member in which the acoustic velocity of a bulk wave that propagates therethrough is higher than the acoustic velocity of an elastic wave that propagates through the piezoelectric thin film 42. The high-acoustic-velocity member 44 is preferably made of silicon, aluminum nitride, aluminum oxide, silicon carbide, silicon oxynitride, a DLC film or a material having diamond as a main component, for example. In addition, it is sufficient that the material of the high-acoustic-velocity member 44 be any material having a relatively high acoustic velocity.

In the case where the piezoelectric thin film 42, the low-acoustic-velocity film 43 and the high-acoustic-velocity member 44 are provided, the energy of an elastic wave is able to be effectively confined in this way. In addition, the energy of an elastic wave is able to be confined by using just the piezoelectric thin film 42 and the high-acoustic-velocity member 44. Furthermore, the high-acoustic-velocity member 44 may be a high-acoustic-velocity film, or may be a high-acoustic-velocity support substrate. In the case where the high-acoustic-velocity member 44 is a high-acoustic-velocity film, the elastic wave device 1 may include a support substrate. In the case where the elastic wave device 1 includes a support substrate, a high-acoustic-velocity film is provided on the support substrate, the low-acoustic-velocity film 43 is provided on the high-acoustic-velocity film, the piezoelectric thin film 42 is provided on the low-acoustic-velocity film 43, and a functional electrode is provided on the piezoelectric thin film 42. As the high-acoustic-velocity film, any of various high-acoustic-velocity materials can be used such as aluminum nitride, aluminum oxide, silicon carbide, silicon nitride, silicon oxynitride, a DLC film, diamond, a substance having any of these materials as a main component, or a substance having a mixture of any of these materials as a main component. As the high-acoustic-velocity support substrate, a piezoelectric material such as aluminum nitride, aluminum oxide, silicon carbide, silicon nitride, silicon, sapphire, lithium tantalate, lithium niobate or quartz, any of various ceramics such as alumina, zirconia, cordierite, mullite, steatite or forsterite, magnesia diamond, a material having any of these materials as a main component, or a material having a mixture of any of these materials as a main component can be used, for example. As the support substrate, a piezoelectric material such as silicon, sapphire, lithium tantalate, lithium niobate or quartz, any of various ceramics such as alumina, magnesia, silicon nitride, aluminum nitride, silicon carbide, zirconia, cordierite, mullite, steatite or forsterite, a dielectric such as glass, a semiconductor such as gallium nitride, or a resin substrate can be used, for example.

Hereafter, a non-limiting example of a method of manufacturing the elastic wave device 1 will be described.

Figure 6A:
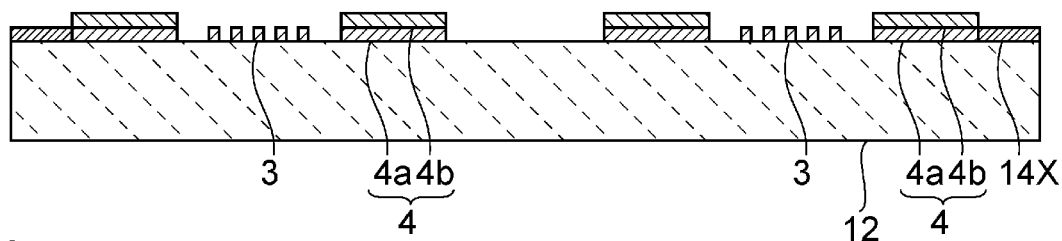
FIGS. 6A to 6C are front sectional views for explaining a method of manufacturing the elastic wave device according to the first preferred embodiment of the present invention.
Figure 6B:
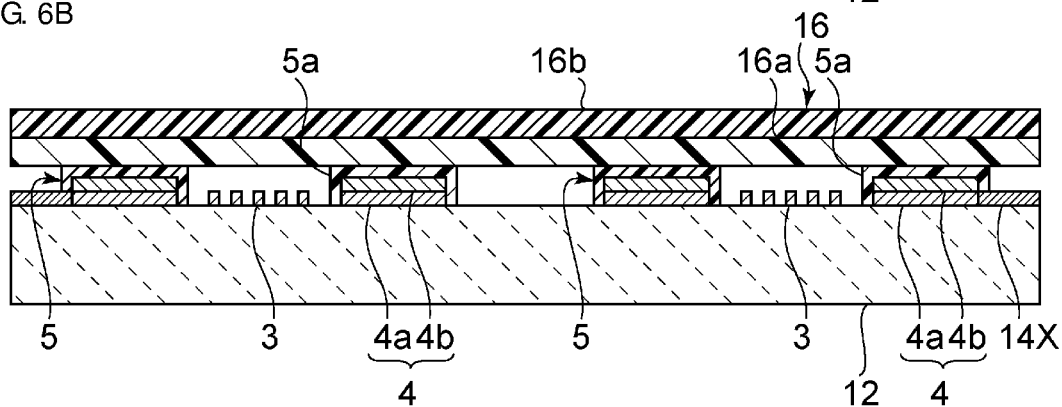
Figure 6C:
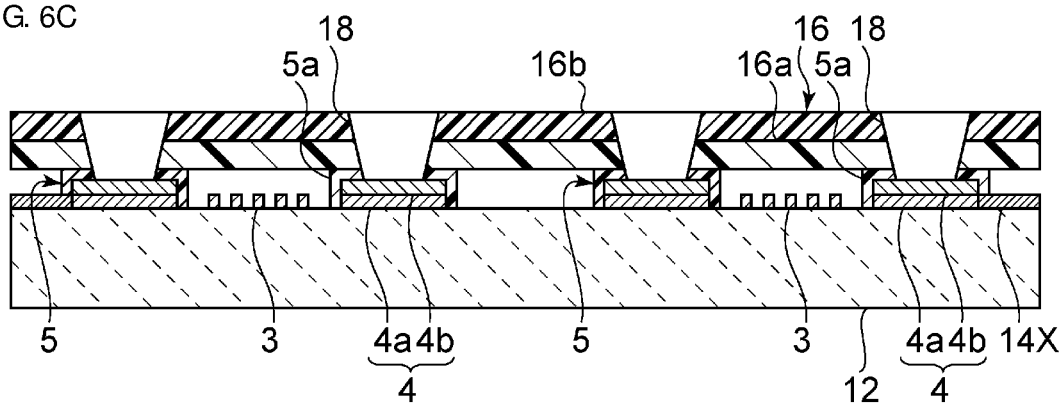
Figure 7A:
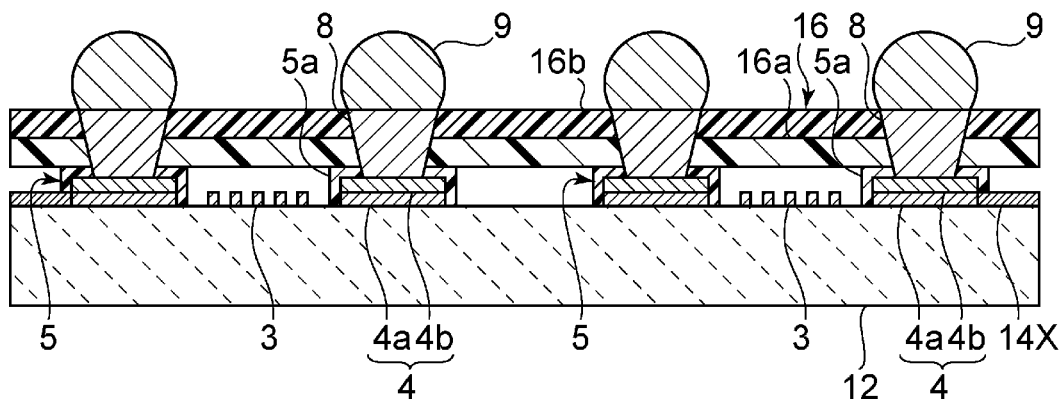
FIGS. 7A to 7C are front sectional views for explaining a method of manufacturing the elastic wave device according to the first preferred embodiment of the present invention.
Figure 7B:
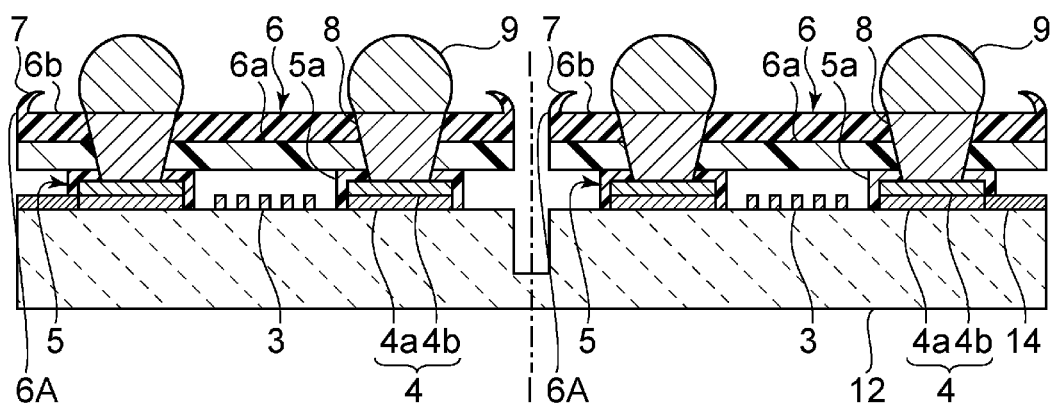
Figure 7C:
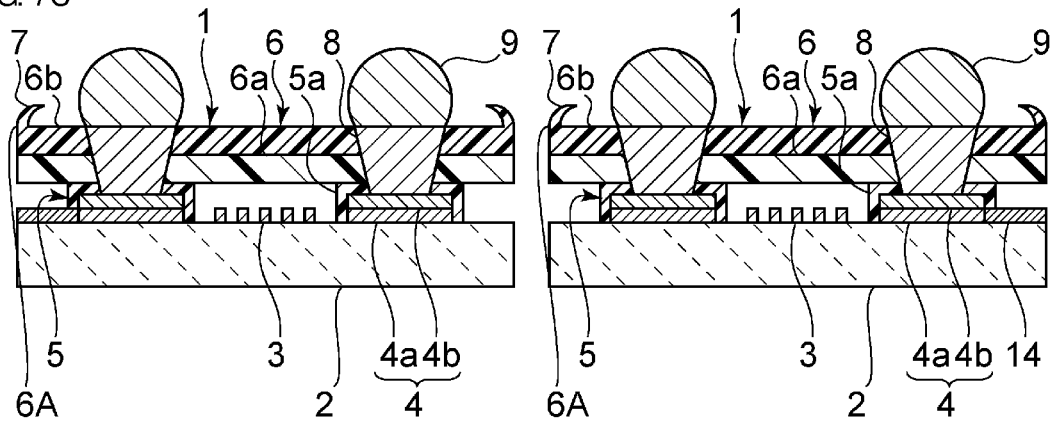

FIGS. 6A to 6C are front sectional views for explaining a method of manufacturing the elastic wave device according to the first preferred embodiment. FIGS. 7A to 7C are front sectional views for explaining the method of manufacturing the elastic wave device according to the first preferred embodiment.

As illustrated in FIG. 6A, a mother substrate 12 is prepared. The mother substrate 12 is not particularly limited, and is preferably made of a piezoelectric single crystal such as $LiNbO_3$ or $LiTaO_3$ or a suitable piezoelectric ceramic.

Next, a plurality of IDT electrodes 3, electrode pads 4 and a power feeding wiring line 14X are formed on the mother substrate 12. The IDT electrodes 3, the electrode pads 4 and the power feeding wiring line 14X can be formed using a sputtering method or a vapor deposition method, for example.

Next, as illustrated in FIG. 6B, a plurality of support members 5 are provided on the mother substrate 12 so as to surround the IDT electrodes 3. The support members 5 can be provided using a photolithography method, for example. Next, a prior-to-cutting cover 16 is provided on the plurality of support members 5 so as to cover the openings 5a of the plurality of support members 5. At this time, for example, a first layer 16a may be provided on the plurality of support members 5, and then a second layer 16b may be stacked on the first layer 16a. Alternatively, first, a multilayer body may be formed by stacking the first layer 16a and the second layer 16b, and then the multilayer body may be stacked on the plurality of support members 5.

Next, as illustrated in FIG. 6C, through holes 18 are formed so as to penetrate through the support members 5 and the prior-to-cutting cover 16. The through holes 18 are formed so as to reach the electrode pads 4. The through holes 18 can be formed through laser irradiation or mechanical machining, for example.

Next, as illustrated in FIG. 7A, the via electrodes 8 are formed inside the through holes. The via electrodes 8 are formed so as to be connected to the electrode pads 4. When manufacturing the elastic wave device 1, the via electrodes 8 are formed using an electroplating method using the power feeding wiring line 14X. The via electrodes 8 may be formed using a method other than an electroplating method. Next, the bumps 9 are provided so as to be bonded to the via electrodes 8.

Next, as illustrated in FIG. 7B, cutting is performed along dicing lines I-I using a dicing machine in order to cut the prior-to-cutting cover 16. As a result, a plurality of covers 6 are obtained. When the cutting is performed using a dicing machine, the outer peripheral edge 6A of the cover 6 is deformed through contact between the outer peripheral edge 6A and the blade of the dicing machine, and as a result the protruding portion 7 is formed. It is preferable that the dicing speed be made high such that processing load applied to the cover 6 is high, for example. In this way, the protruding portion 7 is easily formed.

It is preferable that the cover 6 be subjected to final curing after being cut with the dicing machine. When the prior-to-cutting cover 16 has not been subjected to final curing, the outer peripheral edge 6A of the cover 6 readily deforms, and therefore the protruding portion 7 is able to be formed more easily.

As illustrated in FIG. 7B, the mother substrate 12 is cut halfway through at the same time as the prior-to-cutting cover is cut with a dicing machine. The power feeding wiring line 14X is cut at this time, and the wiring electrode 14 is formed. Next, the cover 6 side of the device is fixed in place using grinding tape, and the surface of the mother substrate 12 on the opposite from the cover 6 is subjected to grinding. Thus, the mother substrate 12 is divided into pieces, and as illustrated in FIG. 7C, a plurality of elastic wave devices 1 are obtained. The thickness of the piezoelectric substrate 2 is able to be easily adjusted through the grinding.

In the step illustrated in FIG. 7B, a plurality of elastic wave devices 1 may be obtained by cutting the mother substrate 12.

The elastic wave device can be used as a duplexer in a high-frequency front end circuit, for example. This example will be described below.

Figure 8:
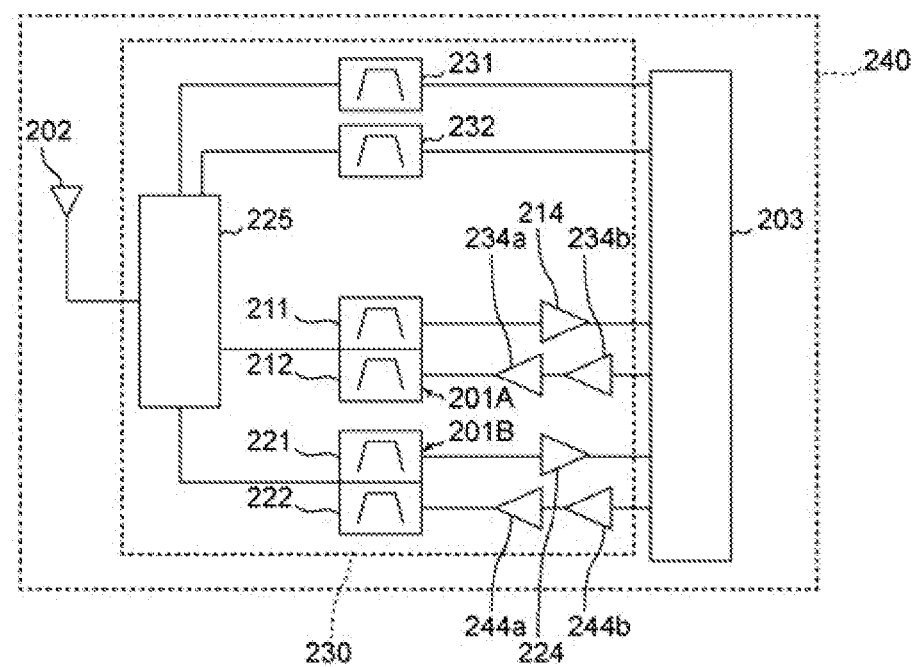
FIG. 8 is a diagram of the configuration of a communication device that includes a high-frequency front end circuit.

FIG. 8 is a diagram of the configuration of a communication device that includes a high-frequency front end circuit. Elements that are connected to a high-frequency front end circuit 230 such an antenna element 202 and an RF signal processing circuit (RFIC) 203 are also illustrated in this figure. The high-frequency front end circuit 230 and the RF signal processing circuit 203 provide a communication device 240. The communication device 240 may include a power source, a CPU, a display and so forth.

The high-frequency front end circuit 230 preferably includes a switch 225, duplexers 201A and 201B, filters 231 and 232, low-noise amplifier circuits 214 and 224, and power amplifier circuits 234a, 234b, 244a and 244b, for example. The high-frequency front end circuit 230 and the communication device 240 illustrated in FIG. 8 are examples of a high-frequency front end circuit and a communication device, and the high-frequency front end circuit 230 and the communication device 240 are not limited to these configurations.

The duplexer 201A includes filters 211 and 212. The duplexer 201B includes filters 221 and 222. The duplexers 201A and 201B are connected to the antenna element 202 via the switch 225. The elastic wave device described above may be used to provide each of the duplexers 201A and 201B and the filters 211, 212, 221 and 222. The elastic wave device described above may be an elastic wave resonator that is used to provide the duplexers 201A and 201B and the filters 211, 212, 221 and 222. In addition, the elastic wave device described above can be applied to a multiplexer that includes three or more filters such as a triplexer in which three filters are commonly connected to an antenna terminal or a hexaplexer in which six filters are commonly connected to an antenna element. In other words, the elastic wave device described above may be used to provide an elastic wave resonator, a filter, a duplexer or a multiplexer including three or more filters. Such a multiplexer is not limited to a configuration that includes both a transmission filter and a reception filter, and may have a configuration that includes only a transmission filter or only a reception filter.

The switch 225 connects the antenna element 202 and a signal path corresponding to a prescribed band in accordance with a control signal from a controller (not illustrated), and may preferably include a single pole double throw (SPDT) switch, for example. Not limited to one signal path, there may be a plurality of signal paths that are connected to the antenna element 202. In other words, the high-frequency front end circuit 230 may support carrier aggregation.

The low-noise amplifier circuit 214 is a reception amplifier circuit that amplifies a high-frequency signal (in this case, high-frequency reception signal) supplied thereto via the antenna element 202, the switch 225 and the duplexer 201A, and outputs the amplified high-frequency signal to the RF signal processing circuit 203. The low-noise amplifier circuit 224 is a reception amplifier circuit that amplifies a high-frequency signal (in this case, high-frequency reception signal) supplied thereto via the antenna element 202, the switch 225 and the duplexer 201B, and outputs the amplified high-frequency signal to the RF signal processing circuit 203.

The power amplifier circuits 234a and 234b are transmission amplifier circuits that amplify a high-frequency signal output from the RF signal processing circuit 203 (in this case, high-frequency transmission signal), and output the amplified high-frequency signal to the antenna element 202 via the duplexer 201A and the switch 225. The power amplifier circuits 244a and 244b are transmission amplifier circuits that amplify a high-frequency signal output from the RF signal processing circuit 203 (in this case, high-frequency transmission signal), and output the amplified high-frequency signal to the antenna element 202 via the duplexer 201B and the switch 225.

The RF signal processing circuit 203 subjects a high-frequency reception signal input thereto from the antenna element 202 via the reception signal path to signal processing based on down conversion and so forth, and outputs a reception signal generated through the signal processing. In addition, the RF signal processing circuit 203 subjects a transmission signal to signal processing based on up conversion and so forth, and outputs the high-frequency transmission signal generated through the signal processing to the power amplifier circuit 234a, 234b, 244a or 244b. The RF signal processing circuit 203 is an RFIC, for example. In addition, the RF signal processing circuit 203 may include a baseband signal processing circuit. In addition, the high-frequency front end circuit 230 may include other circuit elements between the above-described elements or features.

On the other hand, the filters 231 and 232 of the communication device 240 are connected between the RF signal processing circuit 203 and the switch 225 without low-noise amplifier circuits and power amplifier circuits interposed therebetween. The filters 231 and 232 are also connected to the antenna element 202 via the switch 225, similarly to the duplexers 201A and 201B.

According to the thus-configured high-frequency front end circuit 230 and communication device 240, the effect of flux, which is used for cleaning bumps, on elements is significantly reduced or prevented as a result of the high-frequency front end circuit 230 and the communication device 240 being provided with an elastic wave resonator, a filter, a duplexer or a multiplexer including three or more filters including the elastic wave device according to a preferred embodiment of the present invention. Therefore, degradation of the functionality of the elements is unlikely to occur.

Elastic wave devices, high-frequency front end circuits and communication devices according to preferred embodiments of the present invention have been described above with respect to preferred embodiments and modifications, but other preferred embodiments realized by combining any of the elements or features of the preferred embodiments and modifications described above, modifications obtained by modifying the above-described preferred embodiments in various ways as thought of by one skilled in the art within a range that does not depart from the gist of the present invention, and various devices into which the high-frequency front end circuits and communication devices according to preferred embodiments of the present invention have been incorporated are also included in the scope of the present invention.

Preferred embodiments of the present invention are able to be widely used in communication devices such as cellular phones as filters, multiplexers that can be applied to a multiband system, front end circuits and communication devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
    a piezoelectric body;
    a functional electrode that is provided on the piezoelectric body;
    a support member that is provided on the piezoelectric body and surrounds the functional electrode;
    a cover that covers the support member;
    a via electrode that penetrates through the support member and the cover; and
    a bump that is bonded to the via electrode; wherein
    the functional electrode is located in a hollow space enclosed by the piezoelectric body, the support member and the cover;
    a protruding portion extends along at least a portion of an outer peripheral edge of a surface of the cover that is on an opposite side from the piezoelectric body;
    the protruding portion extends in a direction away from the piezoelectric body; and
    the support member includes an opening that defines the hollow space, and the functional electrode is located in the opening of the support member.

2. The elastic wave device according to claim 1, wherein, in plan view, the protruding portion is frame-shaped or substantially frame-shaped and is provided along an entire outer peripheral edge of the surface of the cover that is on the opposite side from the piezoelectric body.

3. The elastic wave device according to claim 1, wherein the cover includes a resin.

4. The elastic wave device according to claim 1, wherein the cover includes a first layer that is provided on the support member, and a second layer that is provided on the first layer.

5. The elastic wave device according to claim 1, wherein the functional electrode is an IDT electrode.

6. A high-frequency front end circuit comprising:
the elastic wave device according to claim 1; and
a power amplifier.

7. The high-frequency front end circuit according to claim 6, wherein, in plan view, the protruding portion is frame-shaped or substantially frame-shaped and is provided along an entire outer peripheral edge of the surface of the cover that is on the opposite side from the piezoelectric body.

8. The high-frequency front end circuit according to claim 6, wherein the cover includes a resin.

9. The high-frequency front end circuit according to claim 6, wherein the cover includes a first layer that is provided on the support member, and a second layer that is provided on the first layer.

10. The high-frequency front end circuit according to claim 6, wherein the functional electrode is an IDT electrode.

11. A communication device comprising:
the high-frequency front end circuit according to claim 6; and
an RF signal processing circuit.

12. The communication device according to claim 11, wherein, in plan view, the protruding portion is frame-shaped or substantially frame-shaped and is provided along an entire outer peripheral edge of the surface of the cover that is on the opposite side from the piezoelectric body.

13. The communication device according to claim 11, wherein the cover includes a resin.

14. The communication device according to claim 11, wherein the cover includes a first layer that is provided on the support member, and a second layer that is provided on the first layer.

15. The communication device according to claim 11, wherein the functional electrode is an IDT electrode.

* * * * *